United States Patent
Brun et al.

(10) Patent No.: US 12,368,089 B2
(45) Date of Patent: Jul. 22, 2025

(54) LOW COST EMBEDDED INTEGRATED CIRCUIT DIES

(71) Applicant: Intel Corporation, Santa Clara, CA (US)

(72) Inventors: Xavier Francois Brun, Hillsboro, OR (US); Sanka Ganesan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 652 days.

(21) Appl. No.: 17/467,666

(22) Filed: Sep. 7, 2021

(65) Prior Publication Data

US 2023/0074181 A1    Mar. 9, 2023

(51) Int. Cl.
*H01L 23/48* (2006.01)
*H01L 23/00* (2006.01)
*H01L 23/495* (2006.01)

(52) U.S. Cl.
CPC ...... *H01L 23/481* (2013.01); *H01L 23/49513* (2013.01); *H01L 24/17* (2013.01); *H01L 2224/16146* (2013.01); *H01L 2224/16235* (2013.01)

(58) Field of Classification Search
CPC . H01L 23/481; H01L 23/49513; H01L 24/17; H01L 2224/16146
See application file for complete search history.

(56) References Cited

U.S. PATENT DOCUMENTS

| | | | | |
|---|---|---|---|---|
| 9,128,123 B2* | 9/2015 | Liu | .......................... | H01L 22/34 |
| 10,510,691 B2* | 12/2019 | Liu | ....................... | H01L 23/562 |
| 11,437,348 B2* | 9/2022 | Elsherbini | ........... | H01L 23/3675 |
| 11,557,579 B2* | 1/2023 | Zhang | .................... | H01L 21/563 |
| 11,616,047 B2* | 3/2023 | Elsherbini | ............... | H01L 24/83 |
| | | | | 257/737 |
| 11,855,130 B2* | 12/2023 | Chang | .................... | H01L 23/481 |
| 2006/0246621 A1* | 11/2006 | Crippen | .................. | H01L 23/36 |
| | | | | 257/E23.101 |
| 2012/0074559 A1* | 3/2012 | Budell | ................ | H01L 25/0657 |
| | | | | 257/E23.011 |
| 2019/0051621 A1* | 2/2019 | Liu | .................... | H01L 23/49838 |

(Continued)

FOREIGN PATENT DOCUMENTS

| CN | 115775790 A | * | 3/2023 | ........... H01L 23/481 |
|---|---|---|---|---|
| CN | 116504749 A | * | 7/2023 | ........... H01L 21/486 |

(Continued)

*Primary Examiner* — Laura M Menz
(74) *Attorney, Agent, or Firm* — Akona IP PC

(57) ABSTRACT

An example microelectronic assembly comprises a support structure; an interposer above the support structure; a first die in the interposer, the first die including through-substrate vias (TSVs); and a second die in the interposer, the second die lacking TSVs. A die-to-package support (DTPS) interconnect field on a first face of the first die is substantially identical to a DTPS interconnect field on a first face of the second die, the DTP interconnect fields comprising a plurality of DTPS interconnects for connecting the first and second dies to the support structure. A die-to-die (DTD) interconnect field on a second face of the first die is substantially identical to a DTD interconnect field on a second face of the second die, the DTD interconnect fields comprising a plurality of DTD interconnects.

20 Claims, 11 Drawing Sheets

(56) References Cited

U.S. PATENT DOCUMENTS

| | | | |
|---|---|---|---|
| 2019/0385977 A1* | 12/2019 | Elsherbini | H01L 24/17 |
| 2020/0091128 A1* | 3/2020 | Elsherbini | H01L 23/5386 |
| 2020/0098621 A1* | 3/2020 | Bharath | H01L 25/18 |
| 2020/0227401 A1* | 7/2020 | Elsherbini | H01L 24/83 |
| 2020/0395272 A1* | 12/2020 | Bang | H01L 23/49548 |
| 2021/0057352 A1* | 2/2021 | Agarwal | H01L 21/4857 |
| 2021/0111156 A1* | 4/2021 | Elsherbini | H01L 24/96 |
| 2022/0173090 A1* | 6/2022 | Gomes | H01L 23/5384 |
| 2022/0216132 A1* | 7/2022 | Bang | H01L 21/78 |
| 2022/0342150 A1* | 10/2022 | Karhade | G02B 6/4274 |
| 2022/0375865 A1* | 11/2022 | Pietambaram | H01L 25/0652 |
| 2022/0392855 A1* | 12/2022 | Darmawikarta | H01G 4/33 |
| 2022/0399277 A1* | 12/2022 | Elsherbini | H01L 25/50 |
| 2023/0060727 A1* | 3/2023 | Radhakrishnan | H01L 24/73 |
| 2023/0068300 A1* | 3/2023 | Bharath | H01L 25/50 |
| 2023/0074181 A1* | 3/2023 | Brun | H01L 23/5384 |
| 2023/0076148 A1* | 3/2023 | Brun | H01L 23/3121 |
| 2023/0081139 A1* | 3/2023 | Valavala | H01L 25/105 257/776 |
| 2023/0085196 A1* | 3/2023 | Akkinepally | H01L 24/25 257/737 |
| 2023/0087367 A1* | 3/2023 | Sun | H01L 21/568 257/774 |
| 2023/0187362 A1* | 6/2023 | Elsherbini | H01L 24/08 257/668 |
| 2023/0187386 A1* | 6/2023 | Pietambaram | H01L 28/10 257/531 |
| 2023/0197661 A1* | 6/2023 | Darmawikarta | H01L 25/18 257/770 |
| 2023/0197675 A1* | 6/2023 | Pasdast | H01L 24/16 257/686 |
| 2023/0282615 A1* | 9/2023 | Wagner | H01L 23/3128 257/686 |
| 2023/0307341 A1* | 9/2023 | Brun | H01L 21/486 |
| 2023/0420373 A1* | 12/2023 | Duong | H01L 23/3121 |
| 2024/0061194 A1* | 2/2024 | Elsherbini | G02B 6/4204 |
| 2024/0063066 A1* | 2/2024 | Karhade | H01L 23/481 |
| 2024/0063178 A1* | 2/2024 | Yao | H01L 24/80 |
| 2024/0063179 A1* | 2/2024 | Elsherbini | H01L 25/50 |
| 2024/0063202 A1* | 2/2024 | Elsherbini | H01L 23/49811 |
| 2024/0096809 A1* | 3/2024 | Tanaka | H01L 24/16 |

FOREIGN PATENT DOCUMENTS

| | | | | |
|---|---|---|---|---|
| DE | 102022117951 A1 | * | 3/2023 | H01L 23/481 |
| DE | 102022128596 A1 | * | 6/2023 | H01L 23/481 |
| DE | 102022129664 A1 | * | 6/2023 | H01L 23/49894 |
| DE | 102022133839 A1 | * | 6/2023 | H01L 23/5385 |
| EP | 4195258 | * | 6/2023 | H01L 23/5385 |
| EP | 4216273 | * | 7/2023 | H01L 21/486 |
| WO | WO-2019132970 A1 | * | 7/2019 | H01L 21/486 |
| WO | WO-2023028016 A1 | * | 3/2023 | H01L 23/3128 |
| WO | WO-2023113938 A1 | * | 6/2023 | H01F 17/0006 |

* cited by examiner

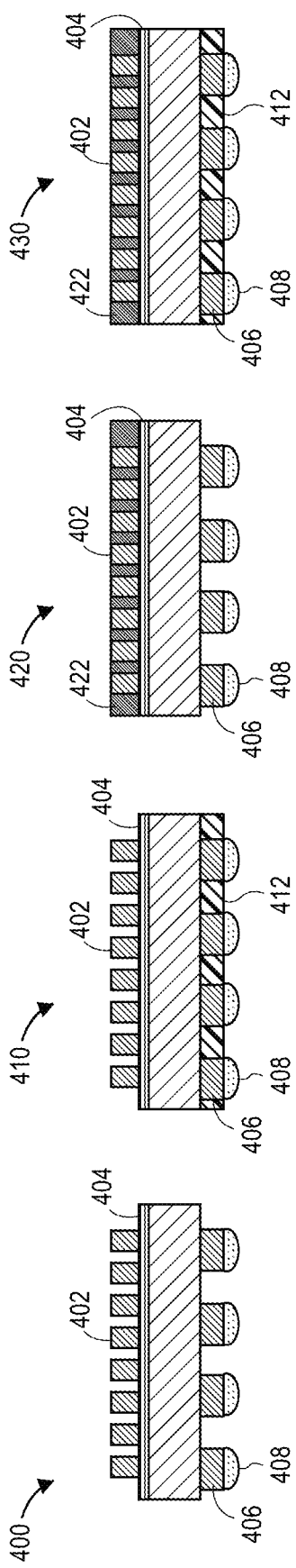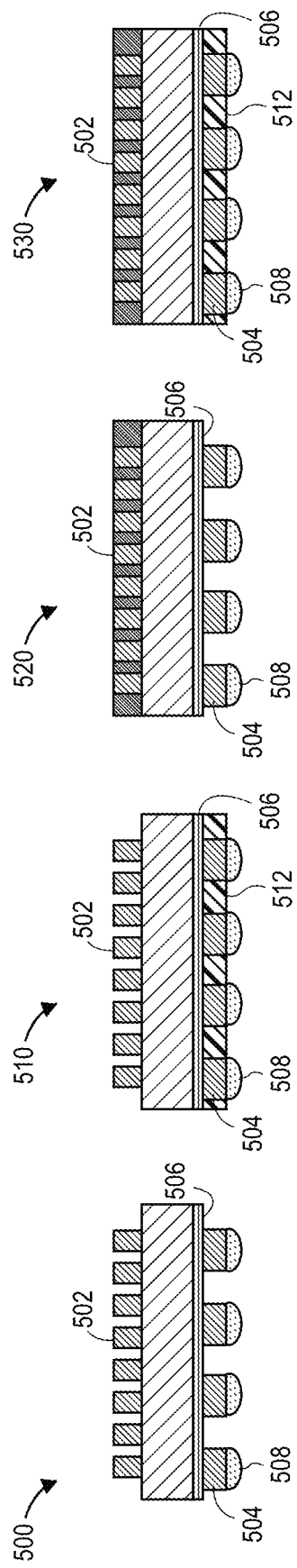

LOW COST EMBEDDED INTEGRATED CIRCUIT DIES

TECHNICAL FIELD

The present disclosure relates to integrated circuit (IC) devices and assemblies. More specifically, it relates to a low cost embedded die for use in such devices and assemblies.

BACKGROUND

When no electrical connection, and hence no solder joint, is needed, it is challenging to constrain lateral motion of the die during a packaging process without a solder joint for connecting the die to a support surface. One solution has been to use a die attach film (DAF) mount solution for non-TSV dies (i.e., dies that do not include through-substrate, e.g., through-silicon, vias (TSVs) to which electrical connections may be made on one or both sides) while leveraging the solder joint for active dies based on wafer-level packaging thermo-compression bonding (TCB) technology.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 4 illustrates schematic cross-sectional views of various embodiments of example non-TSV dies configured for front-to-front (F2F) connections in top die last (TDL) package assembly processes, according to some embodiments of the present disclosure.

FIG. 5 illustrates schematic cross-sectional views of various embodiments of example non-TSV dies configured for front-to-back (F2B) connections in TDL package assembly processes, according to some embodiments of the present disclosure.

DETAILED DESCRIPTION

Figure 1:
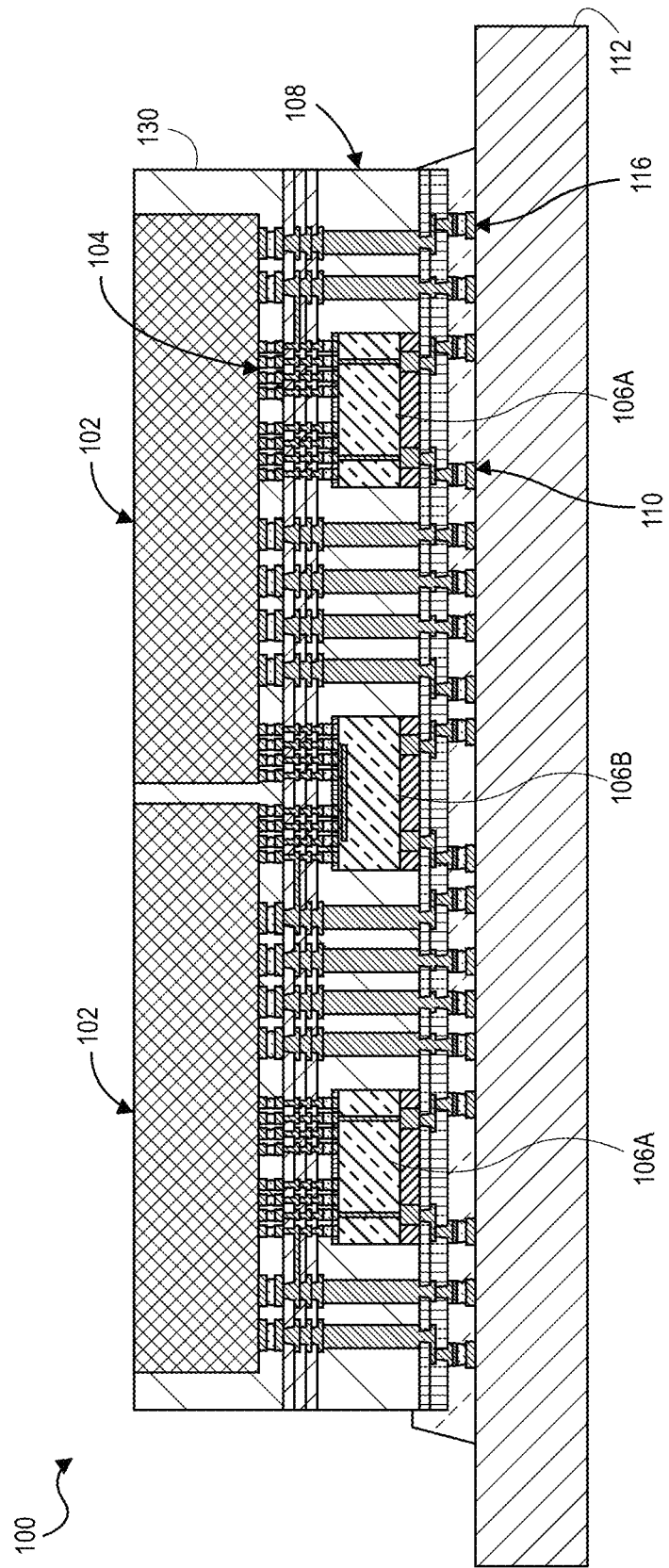
FIG. 1 is a schematic cross-sectional view of an example IC package including a base complex with embedded TSV and non-TSV dies, according to some embodiments of the present disclosure.

For purposes of illustrating embodiments described herein, it is important to understand phenomena that may come into play during packaging of IC structures. The following foundational information may be viewed as a basis from which the present disclosure may be properly explained. Such information is offered for purposes of explanation only and, accordingly, should not be construed in any way to limit the broad scope of the present disclosure and its potential applications.

Currently in certain MCP architectures, solder joints are enabled on dies using TSV alignment marks that enable a direct correlation between a package side bump (PSB) (or die-to-package support (DTPS) bump) field and a silicon interconnect bump (SIB) (or die-to-die (DTD) bump) field. In this case, the SIB field directly defines the interconnect location with top dies. Alternatively, dies that do not require TSVs may be secured in a cavity in a package support structure with DAF, with die motion being constrained by cavity size and Ajinomoto build-up film (ABF) lamination as opposed to a solder joint.

In one aspect of the present disclosure, an example microelectronic assembly includes a support structure, an interposer above the support structure, a first die in the interposer, the first die including TSVs, and a second die in the interposer, the second die lacking TSVs. A DTPS interconnect field on a first face of the first die is substantially identical to a DTPS interconnect field on a first face of the second die, the DTPS interconnect fields comprising a plurality of DTPS interconnects for connecting the first and second dies to the support structure. A DTD interconnect field on a second face of the first die is substantially identical to a DTD interconnect field on a second face of the second die, the DTD interconnect fields comprising a plurality of DTD interconnects.

As used herein, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pits or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

FIG. 1 is a schematic cross-sectional illustration of a package 100, according to some embodiments of the present disclosure. As shown in FIG. 1, package 100 may include one or more IC dies, represented in FIG. 1 by dies 102, each of which may include electrical devices including but not limited to processing units (XPUs), electronic integrated circuits (EICs), and memory, for example. Dies 102 may comprise a semiconductor material including, for example, N-type or P-type materials. Dies 102 may include, for example, a crystalline substrate formed using a bulk silicon (or other bulk semiconductor material) or a semiconductor-on-insulator (SOI, e.g., a silicon-on-insulator) structure. In some embodiments, dies 102 may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, dies 102 may comprise a non-crystalline material, such as polymers. In some embodiments, dies 102 may be inhomogeneous, including a carrier material (such as glass or silicon carbide) as a substrate with a thin semiconductor layer over which is an active side of the die 102. Although a few examples of the material for dies 102 are described here, any material or structure that may serve as a foundation upon which IC circuits and structures as described herein may be built falls within the spirit and scope of the present disclosure as dies 102.

In the illustrated embodiment, dies 102 may be electrically coupled by way of interconnects 104 to one or more further dies situated in an interposer 108, the one or more further dies represented in FIG. 1 by dies 106A, which include TSVs, and a die 106B, which lacks TSVs. In order to readily distinguish dies 102 from further dies 106A, 106B, dies 102 may be referred to herein as "top dies" or, alternatively, as "second-level dies," while dies 106A, 106B, may be referred to herein as "embedded dies" or, alternatively, as "first-level dies." Interconnects 104 may comprise DTD interconnects along with associated conductive traces, planes, vias, redistribution layers (RDLs), and pads enabling electrical coupling between top dies 102 and embedded dies 106A, 106B. Note that some component parts of interconnects are shown in FIG. 1 but are not labeled separately so as to not clutter the drawing. In some embodiments, interconnects 104 may comprise flip-chip interconnects that enable package 100 to have a smaller footprint and higher die-to-package-package support connection density than could be achieved using conventional wire-bond techniques, in which conductive contacts between top dies 102 and embedded dies 106A, 106B are located on a periphery of top dies 102 and/or embedded dies 106A, 106B. For example, one of top dies 102 having a square shape with side length N may be able to form 4N wire-bond interconnects, versus $N^2$ flip-chip interconnects utilizing the entire "full field" surface area of top die 102. Implementing interconnects 104 in a high-density configuration may enable package 100 to have much lower parasitic inductance relative to using wire-bonds, which may result in improved signal integrity for high-speed signals between top dies 102 and embedded dies 106A, 106B.

In addition, by co-packaging top dies 102 with embedded dies 106A, 106B, using interconnects 104 in a high-density configuration, input/output power can be reduced by limiting electrical signaling to intra-package distances while also reducing cost and signal loss (among other advantages). The three-dimensional (3D) stacked architecture can lower power requirements for data transfer, for example, to 2-3 picoJoules/bit. The high-density configuration can also enable serialization of electromagnetic signals in top dies 102, further allowing fewer number of electrical interconnects with embedded dies 106A, 106B. In some example embodiments, interconnects 104 may be formed with a high-density pitch between approximately 18 and 36 micrometer. In an example embodiment, interconnects 104 may be formed with a high-density pitch of 25 micrometer.

In some embodiments, one or more of embedded dies 106A, 106B, may comprise an IC configured to electrically integrate with one or more of top dies 102 to achieve an intended functionality of package 100. For example, embedded dies 106A, 106B, may be an Application Specific IC (ASIC), such as a switch circuit or driver/receiver circuit used in optical communication systems. In some embodiments, one or more of embedded dies 106A, 106B, may comprise bridge circuit, for example, including an embedded multi-die interconnect bridge having appropriate circuitry on/in a semiconductor substrate to connect at silicon interconnect speeds with a small footprint as part of a particular packaging architecture. In some embodiments, on or more of embedded dies 106A, 106B, may comprise active components, including one or more transistors, voltage converters, trans-impedance amplifiers (TIA), clock and data recovery (CDR) components, microcontrollers, etc. In some embodiments, one or more of embedded dies 106A, 106B, may comprise passive circuitry sufficient to enable interconnection to top dies 102 and other components in package 100 without any active components. In some embodiments, one or more of embedded dies 106A, 106B, may extend under a substantial area of top dies 102; in other embodiments, one or more of embedded dies 106A, 106B, may overlap with top dies 102 along one or more edges. In various embodiments, one or more of embedded dies 106A, 106B, and top dies 102 may overlap sufficiently to enable disposing interconnects 104 with a desired pitch and number of interconnections that enable package 100 to function appropriately.

In various embodiments, interposer 108 may comprise any suitable insulating material, such as an organic material, for example, a polymer with fillers. In some embodiments (e.g., as shown in in FIG. 1), interposer 108 may be formed of a single layer with metallization circuitry on top and bottom surfaces. In other embodiments, interposer 108 may comprise a plurality of layers with metallization circuitry between layers. The 3D architecture as illustrated can allow a smaller footprint overall for package 100.

Interconnects 110 comprising DTPS interconnects, and associated conductive traces, planes, vias, RDLs, and pads may provide electrical coupling between embedded dies 106A, 106B, and a package support 112. Embedded dies 106A, 106B, may alternatively be coupled to package support 112 using other means for electrically and/or physically coupling an IC to a package support, such as with DAF. In various embodiments, package support 112 may comprise a single or multi-layered insulating material with metallization including planes, traces, vias, and passive components (e.g., inductors, capacitors) within the insulating material and/or on the surfaces. Package support 112 may comprise ceramic (e.g., alumina) and/or organic material (e.g., epoxy based FR4, resin based bismaleimide triazine (BT), or polyimide) and may be formed in various varieties including rigid and tape. Package support 112 may provide mechanical base support and appropriate interfaces to access components in package 100 electrically. Interconnects 116 comprising DTPS interconnects, and associated conductive traces, planes, vias, RDLs, copper pillars, and pads may provide electrical coupling between top dies 102 and package support 112.

Interconnects 110 and 116 may comprise any suitable interconnection, including flip-chips and ball grid array (BGA) with corresponding metallization, pads and vias, including TSVs through embedded dies 106A or throughhole vias also called through-mold-vias (TMVs) through interposer 108. Note that the shapes of various interconnects shown in the figure are merely for illustrative purposes and are not to be construed as limitations. The shapes of interconnects 104, 110, and/or 116, for example, may result from natural processes occurring during solder reflow. The shapes may depend on material viscosity in liquid state, temperatures of processing, surface tension forces, capillary action, and other mechanisms beyond the scope of the present disclosure. Interconnects 104, 110, and 116, can enable a particular packaging architecture that enables low power, low loss, high-speed electrical signals between top dies 102 and embedded dies 106A, 106B. Such packaging architectures allow for IC chips to communicate with each other horizontally or vertically, permitting smaller footprint, higher speeds, and reduced power usage for package 100.

It will be recognized that one more levels of underfill and/or solder resist (e.g., organic polymer material such as benzotriazole, imidazole, polyimide, or epoxy) may be provided in package 100 and are not labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc. In other embodiments, the choice of underfill material may be based on material properties and processing conditions, such as cure temperature, glass transition temperature, viscosity and chemical resistance, among other factors. In some embodiments, the choice of underfill material may be based on both design and processing considerations. In some embodiments, solder resist may be a liquid or dry film material including photo-imagable polymers. In some embodiments, solder resist may be non-photo-imagable.

Top dies 102 may be encased by a mold 130. In some embodiments, mold 130 may extend to the surfaces of top dies 102 distant from interposer without overlapping on such surfaces, thereby exposing top dies 102 for direct connection of heat sinks, identifying markers, etc. In some embodiments, mold 130 may cover the surfaces of top dies 102 distant from interposer 108.

Although not specifically shown in all of the present illustrations in order to not clutter the drawings, when DTD or DTPS interconnects are described, a surface of a first IC (or die) may include a first set of conductive contacts, and a surface of a second IC (or die) or a package support may include a second set of conductive contacts. One or more conductive contacts of the first set may then be electrically and mechanically coupled to some of the conductive contacts of the second set by the DTD or DTPS interconnects. In some embodiments, the pitch of the DTD interconnects may be different from the pitch of the DTPS interconnects, although, in other embodiments, these pitches may be substantially the same. In some embodiments, the DTPS interconnects disclosed herein may have a pitch between approximately 80 micrometer and 300 micrometer, while the DTD interconnects disclosed herein may have a pitch between approximately 7 micrometer and 36 micrometer. In an example embodiment, some DTD interconnects have a pitch of 25 micrometer.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the ICs on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects may be solder interconnects that include a solder with a higher melting point than a solder included in some or all of the DTPS interconnects. For example, when the DTD interconnects are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include solder. DTD interconnects that include solder may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package support on either side of a set of DTPS interconnects. In particular, the differences in the material composition of ICs and package supports may result in differential expansion and contraction of the ICs and package supports due to heat generated during operation (as well as the heat applied during various manufacturing operations). To mitigate damage caused by this differential expansion and contraction (e.g., cracking, solder bridging, etc.), the DTPS interconnects in any of the packages as described herein may be formed larger and farther apart than DTD interconnects, which may experience less thermal stress due to the greater material similarity of the pair of dies on either side of the DTD interconnects.

Various conductive contacts used in package 100, for example, conductive contacts that form part of interconnects 104, 110, 116, may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, where the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of top dies 102 and embedded dies 106A, 1066, in contact with solder may be covered by a suitable solder mask material (not shown) that prevents solder from melting and bridging adjacent contacts during solder reflow.

In various embodiments, more or fewer elements described above may be included in package 100, compared to what is shown in FIG. 1. In some embodiments, conductive metallization lines may extend into and out of the plane of the drawing, providing conductive pathways to route electrical to and/or from various elements in package 100. The conductive vias and/or lines that provide conductive pathways in/on the package 100 may be formed using any suitable techniques. Examples of such techniques may include subtractive fabrication techniques, additive or semi-additive fabrication techniques, single Damascene fabrication techniques, dual Damascene fabrication techniques, or any other suitable techniques. In some embodiments, layers of insulator material, such as oxide material or nitride material, may insulate various structures in the conductive pathways from proximate structures, and/or may serve as etch stops during fabrication. In some embodiments, additional layers, such as diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

Note that in the figure, interconnects 104, 110, 116, may be shown aligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on top dies 102 and embedded dies 106A, 106B, may enable any desired placement of solder balls with respect to vias and other circuitry. In a general sense, interconnect structures may be arranged within package 100 to route electrical signals according to a wide variety of designs. During operation of package 100, electrical signals (such as power, input/output (I/O) signals, including various control signals for external and internal control of dies 102) may be routed to and/or from dies 102 through the conductive contacts and conductive pathways of package 100.

Note that FIG. 1 is intended to show relative arrangements of the components within their assemblies, and that, in general, such assemblies may include other components that are not illustrated (e.g., various interfacial layers or various other components related to functionality, electrical connectivity, or thermal mitigation). For example, in some further embodiments, the assemblies as shown in FIG. 1 may include multiple top dies 102 and/or embedded dies 106A, 106B, along with other electrical components.

Additionally, although some components of the assemblies are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 1 herein may be combined with any other features to form a package as described herein, for example, to form a modified package 100. Some such combinations are described above, but, in various embodiments, further combinations and modifications are possible.

Figure 2:
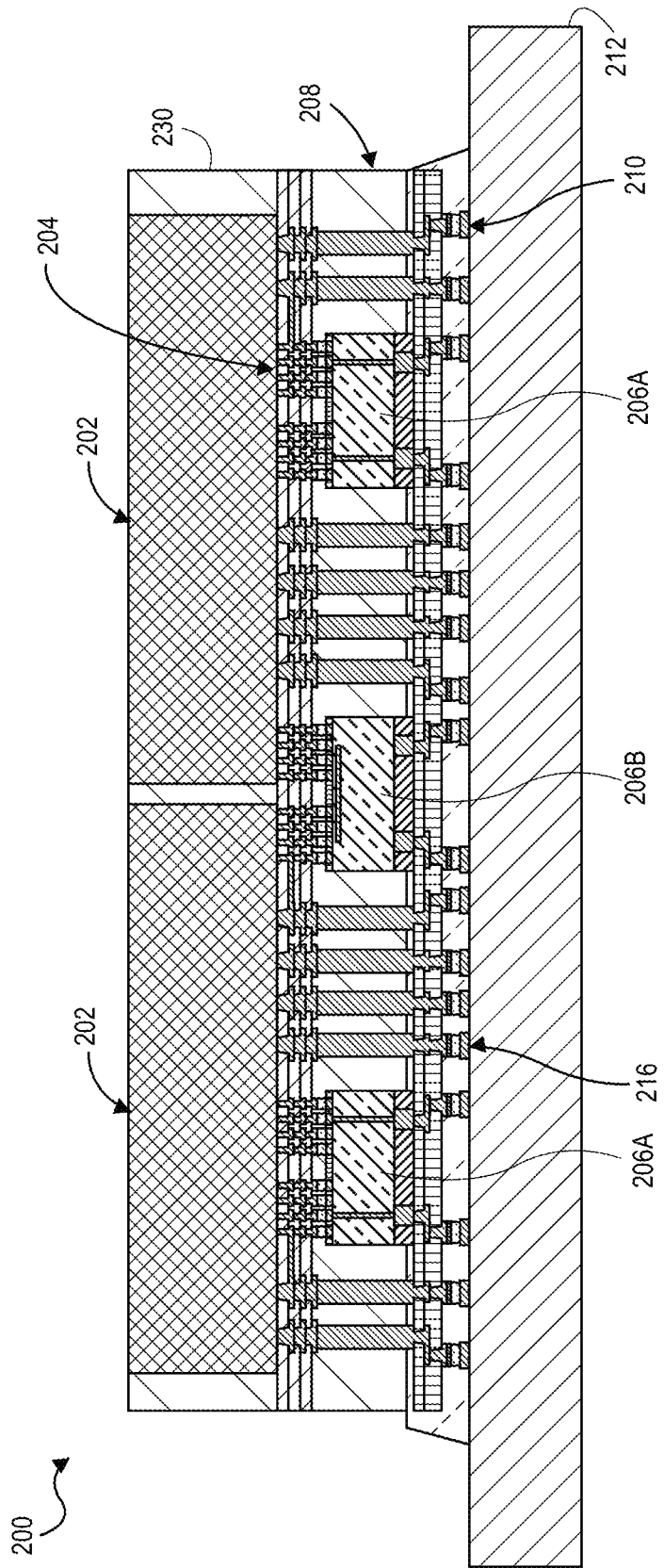
FIG. 2 is a schematic cross-sectional view of another example IC package including a base complex with embedded TSV and non-TSV dies, according to some embodiments of the present disclosure.

FIG. 2 is a schematic cross-sectional illustration of a package 200, according to some embodiments of the present disclosure. Descriptions of package 100 and elements thereof provided with reference to FIG. 1 are applicable to package 200 and elements thereof shown in FIG. 2 and, therefore, in the interest of brevity, may not repeated, with only additional features or differences being described in certain cases.

As shown in FIG. 2, package 200 may include one or more IC dies, represented in FIG. 2 by dies 202. In the illustrated embodiment, dies 202 may be electrically coupled by way of interconnects 204 to one or more dies, represented in FIG. 2 by dies 206A, which include TSVs, and a die 206B, which lacks TWSVs, situated in an interposer 208. As previously noted, in order to readily distinguish dies 202 from die 206A, 206B, dies 202 may be referred to herein as "top dies" or alternatively as "second-level dies," while dies 206A, 206B, may be referred to herein as "embedded dies" or alternatively as a "first-level dies." Interconnects 204 may comprise DTD interconnects along with associated conductive traces, planes, vias, RDLs, and pads enabling electrical coupling between top dies 202 and embedded dies 206A, 206B. Note that some component parts of interconnects are shown in FIG. 2 but are not labeled separately so as not to clutter the drawing. In some embodiments, interconnects 204 may comprise flip-chip interconnects that enable package 200 to achieve a smaller footprint and higher die-to-package-package support connection density than could be achieved using conventional wire-bond techniques as described above.

In some embodiments, one or more of embedded dies 206A, 206B, may comprise an IC configured to electrically integrate with one or more of top dies 202 to achieve an intended functionality of package 200. For example, one or more of embedded dies 206A, 206B, may be an Application Specific IC (ASIC), such as a switch circuit or driver/receiver circuit used in optical communication systems. In some embodiments, one or more of embedded dies 206A, 206B, may comprise a bridge circuit, for example, including an embedded multi-die interconnect bridge having appropriate circuitry on/in a semiconductor substrate to connect at silicon interconnect speeds with a small footprint as part of certain packaging architectures. In some embodiments, one or more of embedded dies 206A, 206B, may comprise active components. In some embodiments, one or more of embedded dies 206A, 206B, may comprise passive circuitry sufficient to enable interconnection to top dies 202 and other components in package 200 without any active components. In some embodiments, one or more of embedded dies 206A, 206B, may extend under a substantial area of top dies 202; in other embodiments, one or more of embedded die 206A, 206B, may overlap with top dies 202 along one or more edges. In various embodiments, one or more of embedded dies 206A, 206B, and top dies 202 may overlap sufficiently to enable disposing interconnects 204 with a desired pitch and number of interconnections that enable package 200 to function appropriately.

In various embodiments, interposer 208 may comprise any suitable insulating material, such as an organic material, for example, a polymer with fillers. In some embodiments (e.g., as shown in FIG. 2), interposer 208 may be formed of a single layer with metallization circuitry on top and bottom surfaces; in other embodiments, interposer 208 may comprise a plurality of layers with metallization circuitry between layers. The 3D architecture as illustrated can allow a smaller footprint overall for photonic package 200.

Interconnects 210 comprising DTPS interconnects, and associated conductive traces, planes, vias, RDLs, and pads may provide electrical coupling between embedded dies 206A, 206B, and a package support 212. Embedded dies 206A, 206B, may alternatively be coupled to package support 212 using other means for electrically and/or physically coupling an IC to a package support, such as with DAF. In various embodiments, package support 212 may comprise a single or multi-layered insulating material with metallization including planes, traces, vias, and passive components (e.g., inductors, capacitors) within the insulating material and/or on the surfaces. Package support 212 may comprise ceramic (e.g., alumina) and/or organic material (e.g., epoxy based FR4, resin based BT, or polyimide) and may be formed in various varieties including rigid and tape. Package support 212 may provide mechanical base support and appropriate interfaces to access components in package 200 electrically. Interconnects 216 comprising DTPS interconnects, and associated conductive traces, planes, vias, copper pillars, RDLs, and pads may provide electrical coupling between top dies 202 and package support 212.

Interconnects 210 and 216 may comprise any suitable interconnection, including flip-chips and BGA with corresponding metallization, pads and vias, including TSVs through embedded dies 206A or TMVs through interposer 208. Note that the shapes of various interconnects shown in the figure are merely for illustrative purposes and are not to be construed as limitations. The shapes of interconnects 204, 210, and/or 216, for example, may result from natural processes occurring during solder reflow. The shapes may depend on material viscosity in liquid state, temperatures of processing, surface tension forces, capillary action, and other mechanisms beyond the scope of the present disclosure. Interconnects 204, 210, and 216, can enable a particular packaging architecture that enables low power, low loss, high-speed electrical signals between top dies 102 and embedded dies 106A, 106B. Such packaging architectures allow for IC chips to communicate with each other horizontally or vertically, permitting smaller footprint, higher speeds, and reduced power usage for package 200.

It will be recognized that one more levels of underfill and/or solder resist may be provided in package 200 and are not labeled in order to avoid cluttering the drawings.

Top dies 202 may be encased by a mold 230. In some embodiments, mold 230 may extend to the surfaces of top dies 202 distant from interposer 208 without overlapping on such surfaces, thereby exposing top dies 202 for direct connection of heat sinks, identifying markers, etc. In some embodiments, mold 230 may cover the surfaces of top dies 202 distant from interposer 208.

Various conductive contacts used in package 200, for example, conductive contacts that form part of interconnects 204, 210, 216, may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, where the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of top dies 202 and embedded dies 206A, 206B, in contact with solder may be covered by a suitable solder mask material (not shown) that prevents solder from melting and bridging adjacent contacts during solder reflow.

In various embodiments, more or fewer elements described above may be included in package 200, compared to what is shown in FIG. 2. Note that in the figure, interconnects 204, 210, 216, may be shown aligned or unaligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on top dies 202 and embedded dies 206A, 206B, may enable any desired placement of solder balls with respect to vias and other circuitry. In a general sense, interconnect structures may be arranged within package 200 to route electrical signals according to a wide variety of designs. During operation of package 200, electrical signals (such as power, input/output (I/O) signals, including various control signals for external and internal control of dies 202) may be routed to and/or from dies 202 through the conductive contacts and conductive pathways of package 200.

Note that FIG. 2 is intended to show relative arrangements of the components within their assemblies, and that, in general, such assemblies may include other components that are not illustrated (e.g., various interfacial layers or various other components related to functionality, electrical connectivity, or thermal mitigation). For example, in some further embodiments, the assemblies as shown in FIG. 2 may include multiple top dies 202 and/or embedded dies 206A, 206B, along with other electrical components.

Additionally, although some components of the assemblies are illustrated in FIG. 2 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 2 herein may be combined with any other features to form a package as described herein, for example, to form a modified package 200. Some such combinations are described above, but, in various embodiments, further combinations and modifications are possible.

Figure 3:
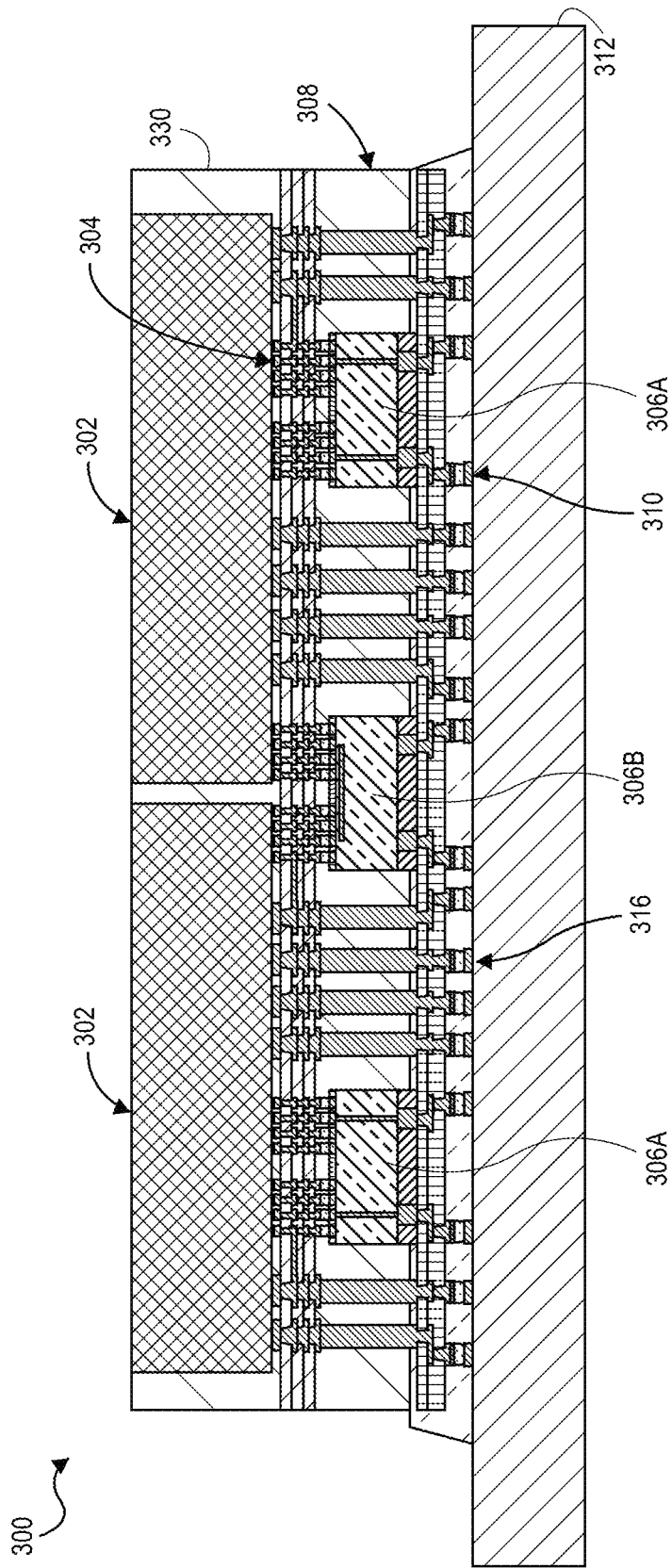
FIG. 3 is a schematic cross-sectional view of another example IC package including a base complex with embedded TSV and non-TSV dies, according to some embodiments of the present disclosure.

FIG. 3 is a schematic cross-sectional illustration of a package 300, according to some embodiments of the present disclosure. Descriptions of package 100 and elements thereof provided with reference to FIG. 1 are applicable to package 300 and elements thereof shown in FIG. 3 and, therefore, in the interest of brevity, may not repeated, with only additional features or differences being described in certain cases.

As shown in FIG. 3, package 300 may include one or more IC dies, represented in FIG. 3 by dies 302. In the illustrated embodiment, dies 302 may be electrically coupled by way of interconnects 304 to one or more dies, represented in FIG. 3 by a dies 306A, which include TSVs, and a die 306B, which lacks TSVs, situated in an interposer 308. As previously noted, in order to readily distinguish dies 302 from dies 306A, 306B, dies 302 may be referred to herein as "top dies" or alternatively as "second-level dies," while dies 306A, 306B, may be referred to herein as "embedded dies" or alternatively as "first-level dies." Interconnects 304 may comprise DTD interconnects along with associated conductive traces, planes, vias, RDLs, and pads enabling electrical coupling between top dies 302 and embedded dies 306A, 306B. Note that some component parts of interconnects are shown in FIG. 3 but are not labeled separately so as not to clutter the drawing. In some embodiments, interconnects 304 may comprise flip-chip interconnects that enable package 300 to achieve a smaller footprint and higher die-to-package-package support connection density than could be achieved using conventional wire-bond techniques as described above.

In some embodiments, one or more of embedded dies 306A, 306B, may comprise an IC configured to electrically integrate with one or more of top dies 302 to achieve an intended functionality of package 300. For example, one or more of embedded dies 306A, 306B, may be an Application Specific IC (ASIC), such as a switch circuit or driver/receiver circuit used in optical communication systems. In some embodiments, one or more of embedded dies 306A, 306B, may comprise a bridge circuit, for example, including an embedded multi-die interconnect bridge having appropriate circuitry on/in a semiconductor substrate to connect at silicon interconnect speeds with a small footprint as part of a particular packaging architecture. In some embodiments, on or more of one or more of embedded dies 306A, 306B, may comprise active components. In some embodiments, one or more of embedded dies 306A, 306B, may comprise passive circuitry sufficient to enable interconnection to top dies 302 and other components in package 300 without any active components. In some embodiments, one or more of embedded dies 306A, 306B, may extend under a substantial area of top dies 302; in other embodiments, one or more of embedded dies 306A, 306B, may overlap with top dies 302 along one or more edges. In various embodiments, one or more of embedded dies 306A, 306B, and top dies 302 may overlap sufficiently to enable disposing interconnects 304 with a desired pitch and number of interconnections that enable package 300 to function appropriately.

In various embodiments, interposer 308 may comprise any suitable insulating material, such as an organic material, for example, a polymer with fillers. In some embodiments (e.g., as shown in in FIG. 3), interposer 308 may be formed of a single layer with metallization circuitry on top and bottom surfaces; in other embodiments, interposer 108 may comprise a plurality of layers with metallization circuitry between layers. The 3D architecture as illustrated can allow a smaller footprint overall for package 300.

Interconnects 310 comprising DTPS interconnects, and associated conductive traces, planes, vias, RDLs, and pads may provide electrical coupling between embedded dies 306A, 306B, and a package support 312. Embedded dies 306A, 306B, may alternatively be coupled to package support 312 using other means for electrically and/or physically coupling an IC to a package support, such as with DAF. In various embodiments, package support 312 may comprise a single or multi-layered insulating material with metallization including planes, traces, vias, and passive components (e.g., inductors, capacitors) within the insulating material and/or on the surfaces. Package support 312 may comprise ceramic (e.g., alumina) and/or organic material (e.g., epoxy based FR4, resin based BT, or polyimide) and may be formed in various varieties including rigid and tape. Package support 312 may provide mechanical base support and appropriate interfaces to access components in package 300 electrically. Interconnects 316 comprising DTPS interconnects, and associated conductive traces, planes, vias, copper pillars 318, RDLs, and pads may provide electrical coupling between top dies 302 and package support 312.

Interconnects 310 and 316 may comprise any suitable interconnection, including flip-chips and BGA with corresponding metallization, pads and vias, including TSVs through embedded dies 306A or TMVs through interposer 308. Note that the shapes of various interconnects shown in the figure are merely for illustrative purposes and are not to be construed as limitations. The shapes of interconnects 304, 305, 310, and/or 316, for example, may result from natural processes occurring during solder reflow. The shapes may depend on material viscosity in liquid state, temperatures of processing, surface tension forces, capillary action, and other mechanisms beyond the scope of the present disclosure. Interconnects 304, 310, and 316, can enable a particular packaging architecture that enables low power, low loss, high-speed electrical signals between top dies 102 and embedded dies 106A, 106B. Such packaging architectures allow for IC chips to communicate with each other horizontally or vertically, permitting smaller footprint, higher speeds, and reduced power usage for package 300.

It will be recognized that one more levels of underfill and/or solder resist may be provided in package 300 and are not labeled in order to avoid cluttering the drawings.

Top dies 302 may be encased by a mold 330. In some embodiments, mold 330 may extend to the surfaces of top dies 302 distant from interposer 308 without overlapping on such surfaces, thereby exposing top dies 302 for direct connection of heat sinks, identifying markers, etc. In some embodiments, mold 330 may cover the surfaces of top dies 302 distant from interposer 308.

Various conductive contacts used in package 300, for example, conductive contacts that form part of interconnects 304, 310, 316, may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, where the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of top dies 302 and embedded dies 306A, 306B, in contact with solder may be covered by a suitable solder mask material (not shown) that prevents solder from melting and bridging adjacent contacts during solder reflow.

In various embodiments, more or fewer elements described above may be included in package 300, compared to what is shown in FIG. 3.

Note that in the figure, interconnects 304, 310, 316, may be shown aligned or unaligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on top dies 302 and embedded dies 306A, 306B, may enable any desired placement of solder balls with respect to vias and other circuitry. In a general sense, interconnect structures may be arranged within package 300 to route electrical signals according to a wide variety of designs. During operation of package 300, electrical signals (such as power, input/output (I/O) signals, including various control signals for external and internal control of dies 302) may be routed to and/or from dies 302 through the conductive contacts and conductive pathways of package 300.

Note that FIG. 3 is intended to show relative arrangements of the components within their assemblies, and that, in general, such assemblies may include other components that are not illustrated (e.g., various interfacial layers or various other components related to functionality, electrical connectivity, or thermal mitigation). For example, in some further embodiments, the assemblies as shown in FIG. 3 may include multiple top dies 302 and/or embedded dies 306A, 306B, along with other electrical components.

Additionally, although some components of the assemblies are illustrated in FIG. 3 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 3 herein may be combined with any other features to form a package as described herein, for example, to form a modified package 300. Some such combinations are described above, but, in various embodiments, further combinations and modifications are possible.

As shown in FIGS. 1-3, packages 100 and 200 are examples of packages assembled using a TDL assembly process, whereas package 300 is an example of a package assembled using a TDF assembly process. Additionally, top dies 202 (FIG. 2) may be referred to as "bumpless dies" because they do not include microbumps on their package-support-facing surfaces, whereas top dies 102, 302, may be referred to as "bumped dies" because they include microbumps on their package-support-facing surfaces.

FIG. 4 illustrates schematic cross-sectional views of various example embodiments of a die that lacks TSVs (non-TSV die) configured for F2F connection with a top die in TDL package assembly processes, according to some embodiments of the present disclosure.

Referring to FIG. 4, a non-TSV die 400 includes DTD bumps 402 on an active face 404 of die 400 and DTPS bumps 406 including solder 408 on an opposite (or "inactive") face of die 400. For an active die, the active face of the die is the face on which the transistors are. For a passive die, the active face is the face on which the stack routings are.

In an alternative embodiment, a non-TSV die 410 includes DTD bumps 402 on active face 464 of die 410 and DTPS bumps 406 including solder 418 on inactive face of die 410. Die 410 also includes package side mold 412 between DTPS bumps 406.

In another alternative embodiment, a non-TSV die 420 includes DTD bumps 402 on active face 404 of die 420 and DTPS bumps 406 including solder 408 on inactive face of die 420. Die 420 also includes silicon-side mold 422 between DTD bumps 402 on active face 404.

In yet another alternative embodiment, a non-TSV die 430 includes DTD bumps 402 on active face 404 of die 430 and DTPS bumps 406 including solder 408 on inactive face of die 430. Die 430 also includes both package side mold 412 and silicon-side mold 422.

FIG. 5 illustrates schematic cross-sectional views of various example embodiments of a non-TSV die configured for F2B connection with a top die in TDL package assembly processes, according to some embodiments of the present disclosure.

Referring to FIG. 5, a non-TSV die 500 includes DTD bumps 502 on an inactive face of die 500 and DTPS bumps 504 on an active face 506. DTPS bumps 504 include solder 508.

In an alternative embodiment, a non-TSV die 510 includes DTD bumps 502 on inactive face of die 510 and DTPS bumps 504 including solder 508 on active face 506. Die 510 also includes package side mold 512 between DTPS bumps 504 on active face 506.

In another alternative embodiment, a non-TSV die 520 includes DTD bumps 502 inactive face of die 520 and DTPS bumps 504 including solder 508 on active face 506. Die 520 also includes silicon-side mold 522 between DTD bumps 504.

In yet another alternative embodiment, a non-TSV die 530 includes DTD bumps 502 on inactive face of die 530 and DTPS bumps 504 including solder 508 on active face 506. Die 530 also includes package side mold 512 and silicon-side mold 522.

Figure 6:
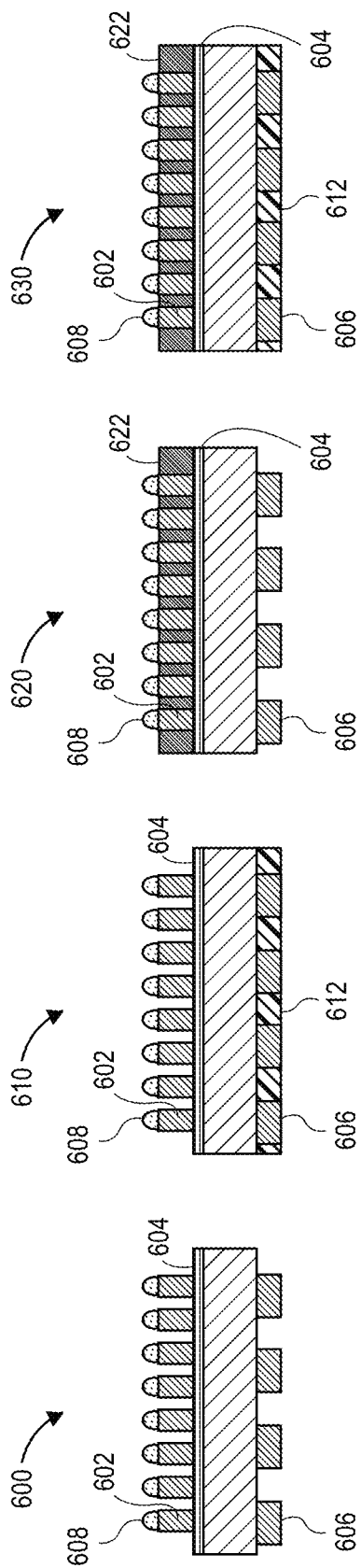
FIG. 6 illustrates schematic cross-sectional views of various embodiments of example non-TSV dies configured for F2F connections in top die first (TDF) package assembly processes, according to some embodiments of the present disclosure.

FIG. 6 illustrates schematic cross-sectional views of various example embodiments of a non-TSV die configured for F2F connections in TDF package assembly processes, according to some embodiments of the present disclosure.

Referring to FIG. 6, a non-TSV die 600 includes DTD bumps 602 on an active face 604 of die 600 and DTPS bumps 606 on an inactive face. DTD bumps 602 include solder 608.

In an alternative embodiment, a non-TSV die 610 includes DTD bumps 602 including solder 608 on active face 604 of die 600 and DTPS bumps 606 on inactive face. Die 610 also includes package side mold 612 between DTPS bumps 606.

In another alternative embodiment, a non-TSV die 620 includes DTD bumps 602 including solder 608 on active face 604 of die 620 and DTPS bumps 606 on inactive face. Die 620 also includes silicon-side mold 622 between DTD bumps 602 on active face 604.

In yet another alternative embodiment, a non-TSV die 630 includes DTD bumps 602 including solder 608 on active face 604 of die 630 and DTPS bumps 606 on inactive face. Die 630 also includes both package side mold 612 and silicon-side mold 622.

Figure 7:
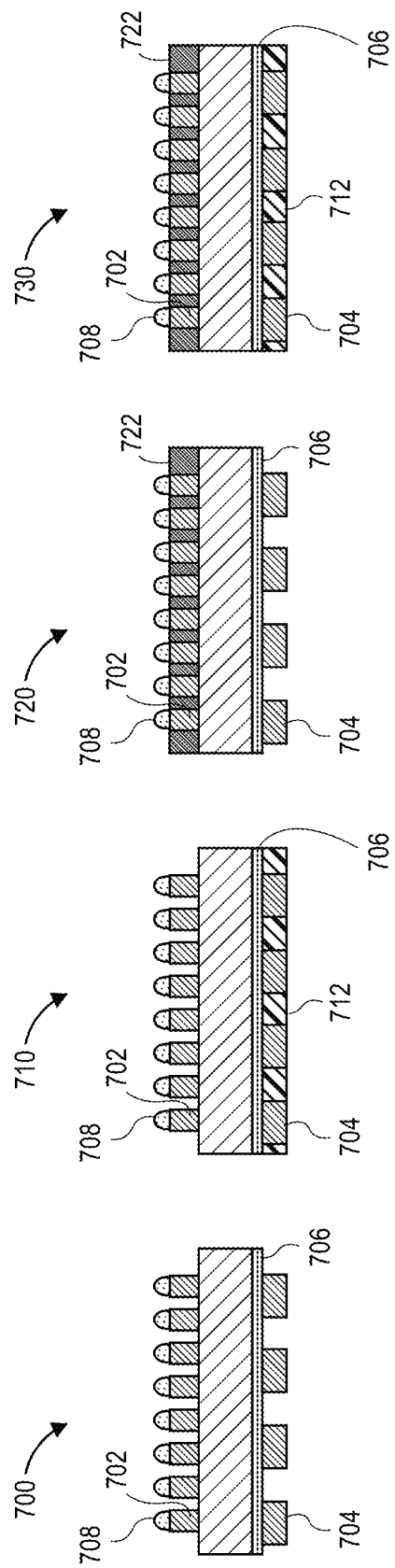
FIG. 7 illustrates schematic cross-sectional views of various embodiments of example non-TSV dies configured for F2B connections in TDF package assembly processes, according to some embodiments of the present disclosure.

FIG. 7 illustrates schematic cross-sectional views of various example embodiments of a non-TSV die configured for F2B connections with a top die in TDF package assembly processes, according to some embodiments of the present disclosure.

Referring to FIG. 7, a non-TSV die 700 includes DTD bumps 702 on an inactive face of die 700 and DTPS bumps 704 on an active face 506. DTD bumps 702 include solder 708.

In an alternative embodiment, a non-TSV die 710 includes DTD bumps 702 including solder 708 on inactive face of die 710 and DTPS bumps 704 on active face 706. Die 710 also includes package side mold 712 between DTPS bumps 704 on active face 706.

In another alternative embodiment, a non-TSV die 720 includes DTD bumps 702 including solder 708 on inactive face of die 720 and DTPS bumps 704 on active face 706. Die 720 also includes silicon-side mold 722 between DTD bumps 702.

In yet another alternative embodiment, a non-TSV die 730 includes DTD bumps 702 including solder 708 on inactive face of die 730 and DTPS bumps 704 including solder 708 on active face 706. Die 730 also includes package side mold 712 and silicon-side mold 722.

FIGS. 8A-8E are schematic cross-sectional illustrations of various stages in an example process for fabricating a non-TSV die, such as example embodiments illustrated in FIGS. 4-7, according to some embodiments of the present disclosure. Although FIGS. 8A-8E illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 8A-8E may be modified in accordance with the present disclosure to fabricate other embodiments of non-TSV dies as disclosed herein.

Figure 8A:
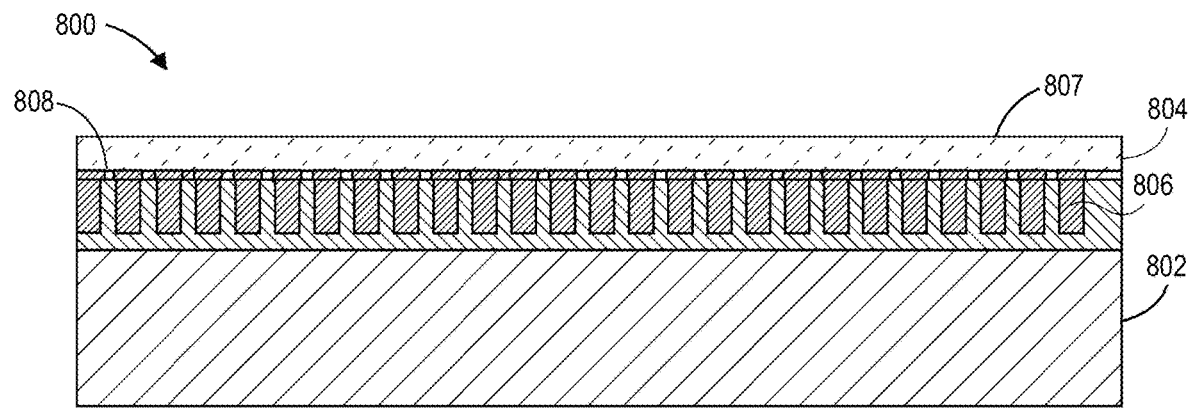
FIGS. 8A-8E are schematic cross-sectional illustrations of various stages in an example process for fabricating a non-TSV die, according to some embodiments of the present disclosure.

FIG. 8A illustrates a microelectronics assembly 800 (alternatively referred to herein as simply "assembly") including a carrier 802, which in certain embodiments is a glass carrier having a thickness of approximately 700 micrometer, supporting a silicon structure 804, which in certain embodiments a silicon wafer having a thickness of about 20 to 80 micrometer. In the illustrated embodiment, DTD bumps 806 are formed on a back surface 807 of silicon structure 804, which is defined as the surface that faces toward carrier 802. In certain embodiments, a front surface 808 of silicon structure 804, which is defined as the surface that faces away from carrier 802, may include a seed layer comprising a thin layer of sputtered or evaporated metal deposited on the wafer for electrical conduction. Depending on the configuration, bumps 806 may include electroplated copper, copper and solder (which may comprise tin and silver (e.g., SnAg)), or other materials as appropriate for a given application.

Figure 8B:
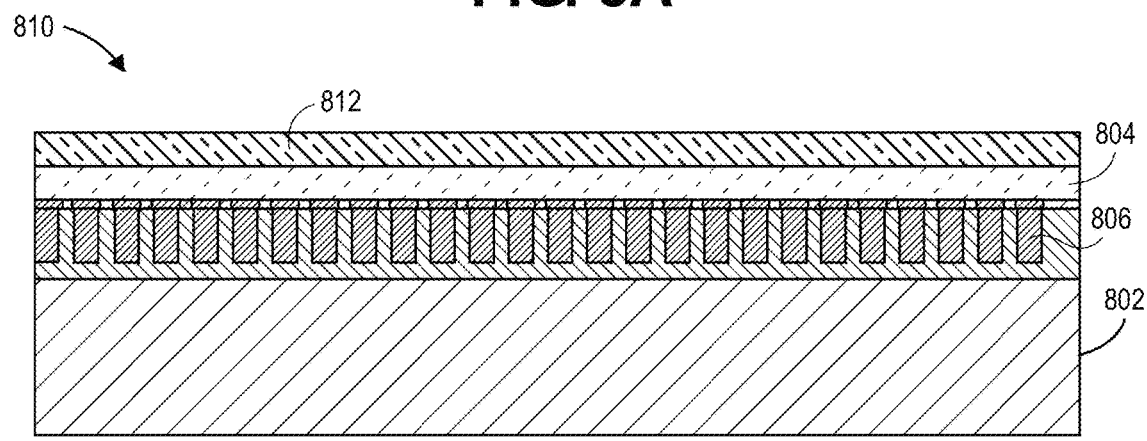

FIG. 8B illustrates a microelectronics assembly 810 that includes assembly 800 (FIG. 8A) on which photoresist material 812 has been deposited on the front surface of silicon structure 804. Deposition techniques could include, but are not limited to, spin-on coating, slit coating, or lamination, to name several possibilities. In certain embodiments, photoresist material 812 and silicon are sufficiently etch-selective. As known in the art, two materials are said to be "sufficiently etch-selective" and/or have "sufficient etch selectivity" when etchants used to etch one material do not substantially etch the other, enabling selective etching of one material but not the other.

It will be recognized that with appropriate design (e.g., metal-free zones) and doping levels, silicon structure 804 is effectively "transparent" to infrared (IR) light. In accordance with features of embodiments described herein, an IR alignment camera is used to pattern the photoresist material 812 of assembly 810 using DTD bumps 806 on the back surface of silicon structure 804 as alignment marks to define locations of DTPS bumps on the front of silicon structure.

Figure 8C:
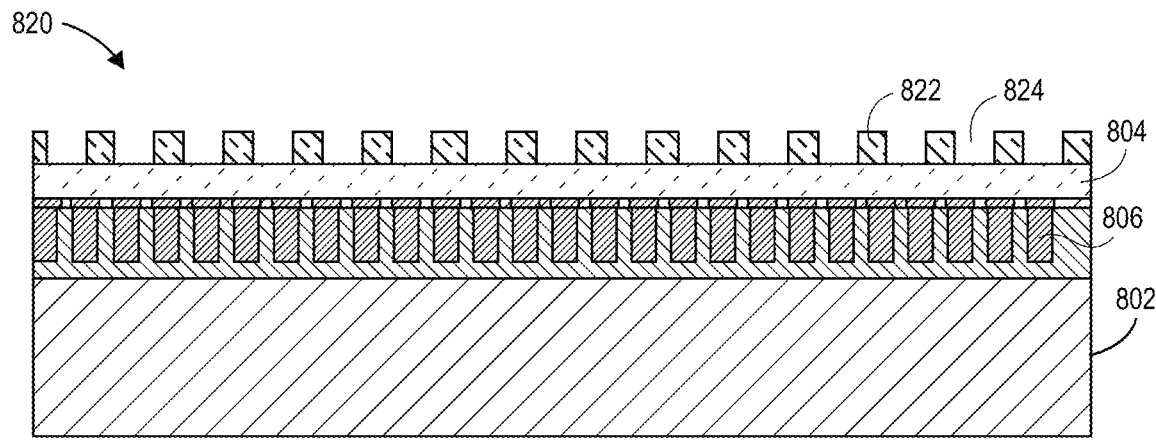

FIG. 8C illustrates an assembly 820 after photoresist material 812 on assembly 810 (FIG. 8B) has been patterned as described above using one of any number of additional photolithography techniques, including but not limited to exposure using an IR alignment camera, development, etching, and/or cleaning, to create a patterned photoresist material 822 including openings 824 comprising to DTPS bump locations as defined using the DTD bumps 806 as alignment marks. Alternatively and/or additionally, alignment marks could be provided on the back side of silicon structure 804 outside the active areas thereof such that the alignment marks on the back side of the structure can be "seen" on the front side of the wafer using the IR camera.

Figure 8D:
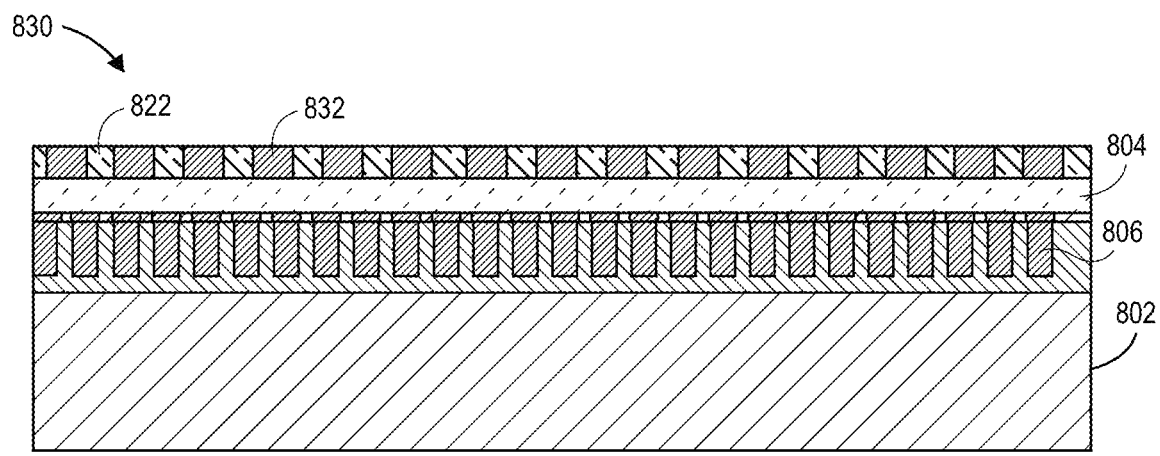

FIG. 8D illustrates an assembly 830 after openings 824 of assembly 820 (FIG. 8C) have been plated to create DTPS bumps 832. Plating of openings 823 may be performed using techniques including but not limited to electroplating of copper or other electrically conductive materials, plugging, and/or copper printing, for example, as well as a combination of copper and solder (e.g., Cu+SnAg).

Figure 8E:
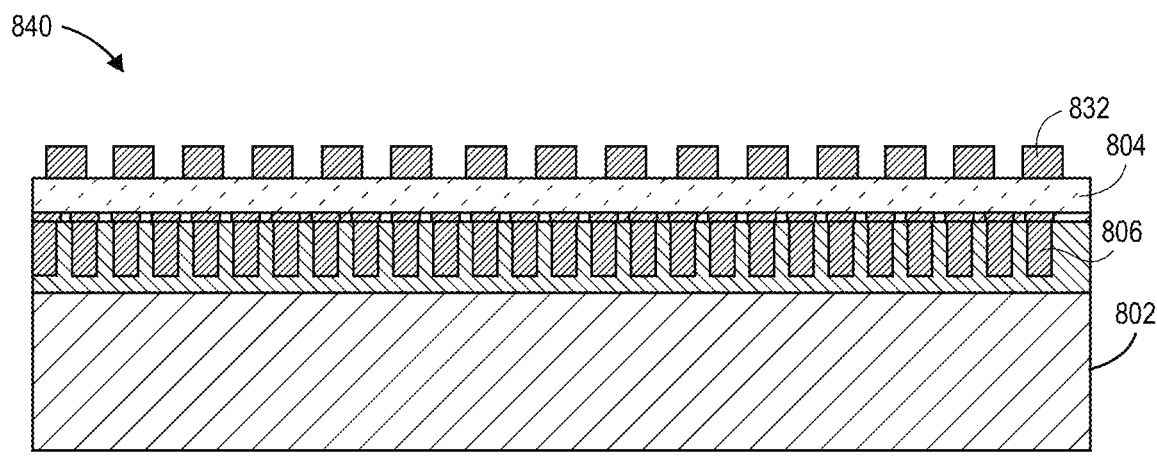

FIG. 8E illustrates an assembly 840 after photoresist material 822 has been stripped from assembly 830 (FIG. 8D) and a top surface has been cleaned as needed. It will be recognized that, although the process illustrated in FIGS. 8A-8E has been described with reference to use of DTD bumps formed on the back of a silicon structure as alignment marks for positioning DTPS bumps on the front of the silicon structure, the same process could be used to form DTD bumps on the front of a silicon structure using DTPS bumps formed on the back of the silicon structure as alignment marks.

Various types of devices and/or packages may be manufactured using techniques as described herein. In some implementations, a choice of fabrication processes or other techniques may depend on how dies are coupled (e.g., using a flip-chip arrangement, or using some other arrangement). In another example, in some implementations, a choice of a technique may depend on the size, arrangement, and/or identity of the device or devices. In yet other examples, a choice of technique may depend on ease of processing and availability of various materials.

Although the operations of the example process show in FIGS. 8A-8E are illustrated in as occurring once each and in a particular order, it will be recognized that the operations may be performed in any suitable order and repeated as desired. For example, one or more operations may be performed in parallel to manufacture multiple devices and/or packages substantially simultaneously. In another example, the operations may be performed in a different order to reflect the structure of a particular package in connection with which the process is implemented.

Furthermore, the operations illustrated in FIGS. 8A-8E may be combined or may include more details than described. Still further, process shown in FIGS. 8A-8E may further include other manufacturing operations related to fabrication of other components of packages in connection with which the method is implemented. For example, process may include seed deposition and removal, via opening before bumping, various cleaning operations, surface planarization operations (e.g., using CMP), operations for surface roughening, operations to include barrier and/or adhesion layers as desired, and/or operations for incorporating packages as described herein in, or with, an IC component, a computing device, or any desired structure or device.

Figure 9:
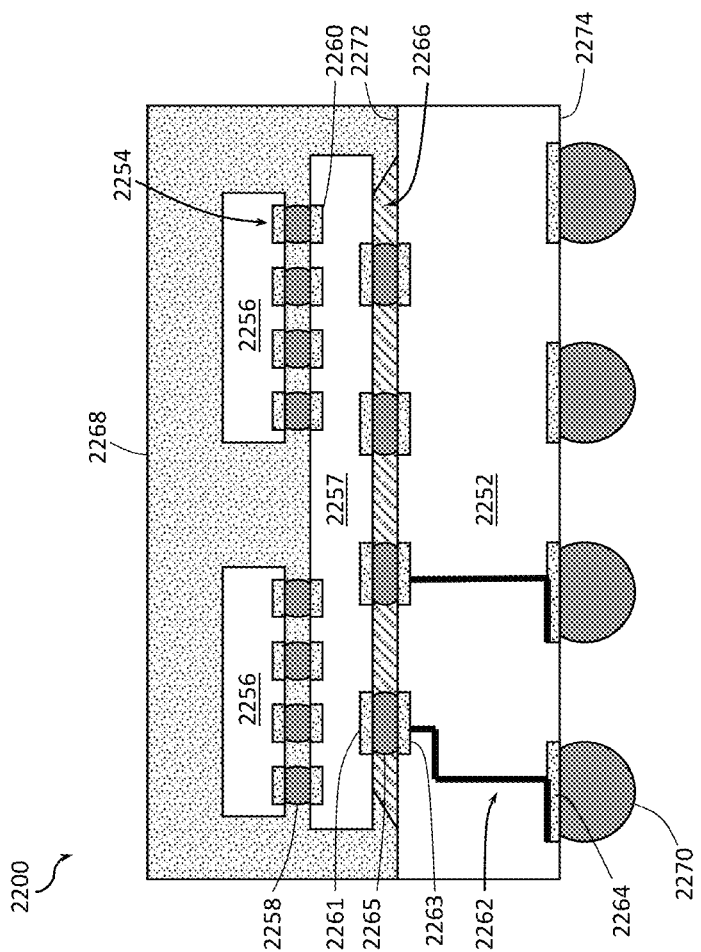
FIG. 9 is a cross-sectional view of a device package that may include one or more components, according to some embodiments of the present disclosure.
Figure 10:
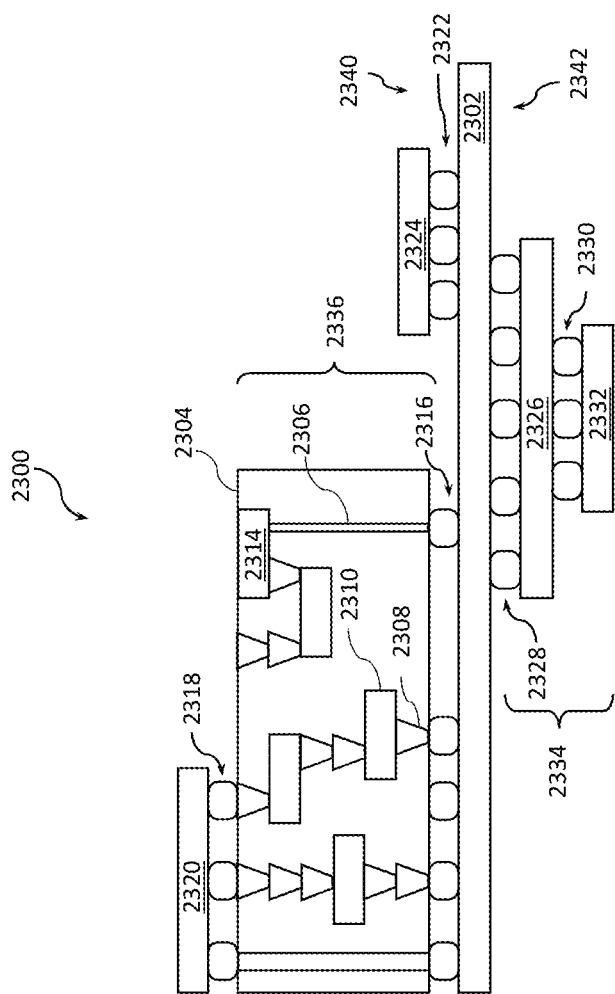
FIG. 10 is a cross-sectional side view of a device assembly that may include one or more components, according to some embodiments of the present disclosure.
Figure 11:
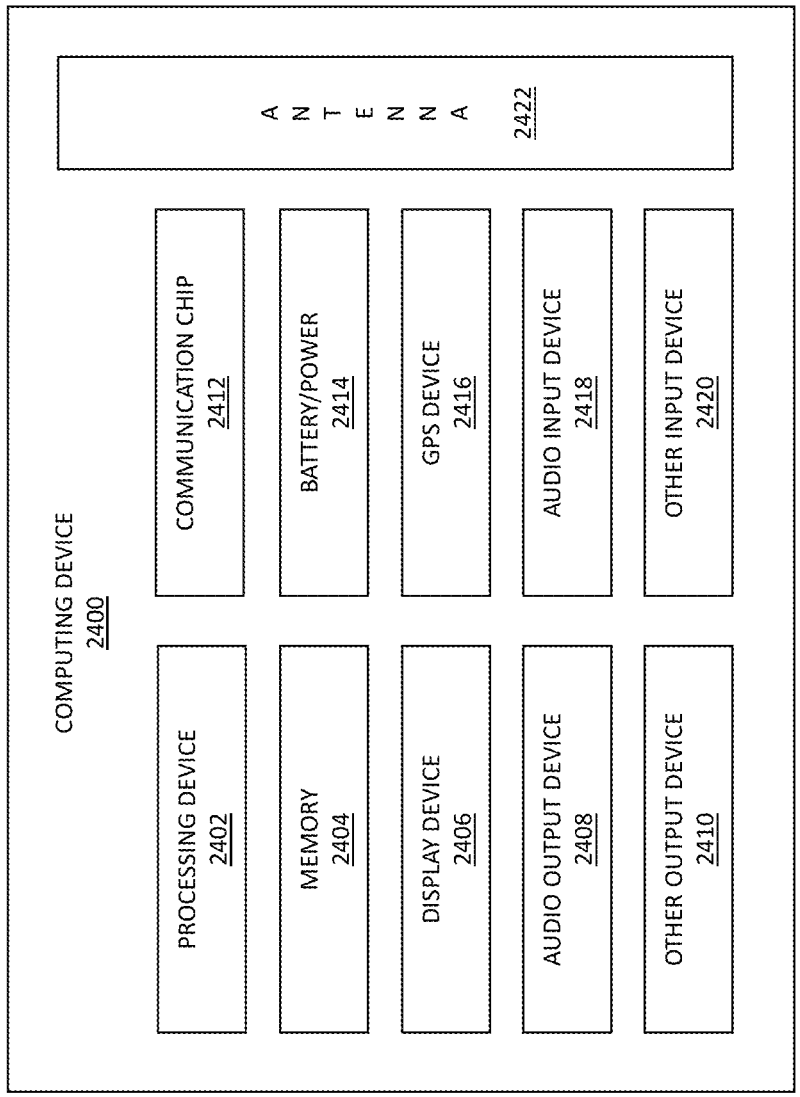
FIG. 11 is a block diagram of an example computing device that may include one or more components, according to some embodiments of the present disclosure.

The package components disclosed herein, e.g., any of the embodiments shown in the figures or any further embodiments described herein, may be included in any suitable component. FIGS. 9-11 illustrate various examples of packages, assemblies, and devices that may be used with or include any of the package components as disclosed herein.

FIG. 9 is a side, cross-sectional view of an example IC package 2200 that may include package components in accordance with any of the embodiments disclosed herein. In some embodiments, the IC package 2200 may be a system-in-package (SiP).

As shown in FIG. 9, package support 2252 may be formed of an insulating material (e.g., a ceramic, a build-up film, an epoxy film having filler particles therein, etc.), and may have conductive pathways extending through the insulating material between first face 2272 and second face 2274, or between different locations on first face 2272, and/or between different locations on second face 2274. These conductive pathways may take the form of any of the interconnect structures comprising lines and/or vias, e.g., as discussed above with reference to the figures.

Package support 2252 may include conductive contacts 2263 that are coupled to conductive pathways 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, first-level interconnects 2265, and conductive contacts 2263 of package support 2252. First-level interconnects 2265 illustrated in FIG. 9 are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in FIG. 9 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around first-level interconnects 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in FIG. 9 are solder balls (e.g., for a BGA arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 10.

In embodiments in which IC package 2200 includes multiple dies 2256, IC package 2200 may be referred to as a multi-chip package (MCP). Dies 2256 may include circuitry to perform any desired functionality. For example, one or more of dies 2256 may be logic dies (e.g., silicon-based dies), one or more of dies 2256 may be memory dies (e.g., high bandwidth memory), etc.

Although IC package 2200 illustrated in FIG. 9 is a flip-chip package, other package architectures may be used.

For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 10 is a cross-sectional side view of an IC device assembly 2300 that may include components having one or more packages 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more packages 100 in accordance with any of the embodiments disclosed herein; e.g., any of the IC packages discussed below with reference to IC device assembly 2300 may take the form of any of the embodiments of IC package 2200 discussed above with reference to FIG. 9.

In some embodiments, circuit board 2302 may be a PCB including multiple metal layers separated from one another by layers of insulating material and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 10 illustrates that, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 9. In some embodiments, IC package 2320 may include at least one package 100 as described herein. Package 100 is not specifically shown in FIG. 10 in order to not clutter the drawing.

Although a single IC package 2320 is shown in FIG. 10, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 10, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304, for example, as shown in FIGS. 1-3.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 11 is a block diagram of an example computing device 2400 that may include one or more package components in accordance with any of the embodiments disclosed herein. For example, any one or more of the components of computing device 2400 may include any embodiments of IC package 2200 (e.g., as shown in FIG. 9). In yet another example, any one or more of the components of computing device 2400 may include an IC device assembly 2300 (e.g., as shown in FIG. 10).

A number of components are illustrated in FIG. 11 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-a-chip (SoC) die.

Additionally, in various embodiments, computing device 2400 may not include one or more of the components illustrated in FIG. 11, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408 but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

The following paragraphs provide various examples of the embodiments disclosed herein.

Example 1 provides a microelectronic assembly that includes a support structure; an interposer above the support structure; a first die in the interposer, the first die including TSVs; and a second die in the interposer, the second die lacking TSVs; where a DTPS interconnect field on a first face of the first die is substantially identical to a DTPS interconnect field on a first face of the second die, the DTP interconnect fields including a plurality of DTPS interconnects for connecting the first and second dies to the support structure; and where a DTD interconnect field on a second face of the first die is substantially identical to a DTD interconnect field on a second face of the second die, the DTD interconnect fields including a plurality of DTD interconnects.

Example 2 provides the microelectronic assembly of example 1, further including a mold material on the first face of the second die.

Example 3 provides the microelectronic assembly of example 2, where the DTPS interconnects of the second die extend through the mold material.

Example 4 provides the microelectronic assembly of any of examples 1, further including a mold material on the second face of the second die.

Example 5 provides the microelectronic assembly of example 4, where the DTD interconnects of the second die extend through the mold material.

Example 6 provides the microelectronic assembly of any of examples 1, further including a mold material on the first and second faces of the second die.

Example 7 provides the microelectronic assembly of example 6, where the DTPS interconnects and the DTD interconnects extend through the mold material.

Example 8 provides the microelectronic assembly of any of examples 1-7, further including a third die, wherein the interposer is between the third die and the support structure.

Example 9 provides the microelectronic assembly of example 8, where an active face of the second die is connected to an active face of the third die with the DTD interconnects.

Example 10 provides the microelectronic assembly of example 9, where an inactive face of the second die opposite the active face of the second die is connected to the support structure with the DTPS interconnects.

Example 11 provides the microelectronic assembly of any of examples 9-10, further including a solder material on the DTD interconnects.

Example 12 provides the microelectronic assembly of any of examples 9-10, further including a solder material on the DTPS interconnects.

Example 13 provides the microelectronic assembly of example 8, where an inactive face of the second die is connected to an active face of the third die with the DTD interconnects.

Example 14 provides the microelectronic assembly of example 13, where an active face of the second die opposite the inactive face of the second die is connected to the support structure with the DTPS interconnects.

Example 15 provides the microelectronic assembly of any of examples 13-14, further including a solder material on the DTD interconnects.

Example 16 provides the microelectronic assembly of any of example 13-14, further including a solder material on the DTPS interconnects.

Example 17 provides the microelectronic assembly of any of examples 1-7, where the first face of the second die includes an active component.

Example 18 provides the microelectronic assembly of any of examples 1-7, wherein the second face of the second die includes an active component.

Example 19 provides an IC package that includes a package support; an interposer; a first die in the interposer, where the first die does not have vias extending between a first face of the first die and a second face of the first die, the second face of the first die being opposite the first face of the first die; a second die, where the interposer is between the second die and the package support; a plurality of DTPS interconnects on the first face of the first die, the plurality of DTPS interconnects coupled to the first die and the package support; and a plurality of DTD interconnects on the second face of the first die, the second face being opposite the first face, and the DTD interconnects coupled to the first die and an active face of the second die.

Example 20 provides the IC package of example 19, where diameters of the DTPS interconnects are larger than diameters of the DTD interconnects.

Example 21 provides the IC package of example 19, where a pitch of the DTPS interconnects is larger than a pitch of the DTD interconnects.

Example 22 provides the IC package of any of examples 19-21, where the second face of the first die is an active face of the first die.

Example 23 provides the IC package of any of examples 19-21, where the second face of the first die is an inactive face of the first die.

Example 24 provides the IC package of any of examples 19-21, further including mold material on the first face of the first die, where the mold material surrounds the DTPS interconnects.

Example 25 provides the IC package of any of examples 19-21, further including mold material on the second face of the first die, where the mold material surrounds the DTD interconnects.

Example 26 provides the IC package of any of examples 19-21, further including mold material on the first and second faces of the second die, where the mold material surrounds the DTPS interconnects and the DTD interconnects.

Example 27 provides the IC package of any of examples 19-21, where an active face of the first die is connected to the active face of the second die with the DTD interconnects.

Example 28 provides the IC package of example 27, where an inactive face of the first die opposite the active face of the first die is connected to the package support with the DTPS interconnects.

Example 29 provides the IC package of any of examples 27-28, further including a solder material on the DTPS interconnects.

Example 30 provides the IC package of any of examples 27-28, further including a solder material on the DTD interconnects.

Example 31 provides the IC package of example 19-21, where an inactive face of the first die is connected to the active face of the second die with the DTD interconnects.

Example 32 provides the IC package of example 31, where an active face of the first die opposite the active face of the first die is connected to the support structure with the DTPS interconnects.

Example 33 provides the IC package of any of examples 31-32, further including a solder material on the DTD interconnects.

Example 34 provides the IC package of any of examples 31-32, further including a solder material on the DTPS interconnects.

Example 35 provides a method of fabricating a microelectronic assembly, the method including providing a wafer including silicon, where the wafer includes first interconnect structures plated on a first face of the wafer; and patterning second interconnect structures on a second face of the wafer, where alignment of the second interconnect structures during the patterning is performed using infrared (IR) alignment with reference to a pattern of the first interconnect structures.

Example 36 provides the method of examples 35, further including, subsequent to the patterning, plating the second interconnect structures on the second face of the wafer.

Example 37 provides the method of any of examples 35-36, where the first interconnect structures have a different diameter than the second interconnect structures.

Example 38 provides the method of any of examples 35-36, where the first interconnect structures have a different pitch than the second interconnect structures.

Example 39 provides the method of any of examples 35-36, where the patterning is performed using an IR camera.

Example 40 provides the method of any of example 35-36, further including depositing a photoresist material on the second side of the wafer.

Example 41 provides the method of any of examples 35-36, where the wafer is undoped.

Example 42 provides the method of any of examples 35-36, further including stripping the photoresist material.

Example 43 provides the method of example 42, where the stripping is performed after the plating.

Example 44 provides the method of any of examples 35-36, where the alignment of the second interconnect structures during the patterning is performed without reference to through-substrate via (TSV) marks on the second face of the wafer.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a package support;
an interposer above the package support;
a first die in the interposer, the first die including through-substrate vias (TSVs); and
a second die in the interposer, the second die lacking TSVs,
wherein a die-to-package support (DTPS) interconnect field on a first face of the first die is substantially identical to a DTPS interconnect field on a first face of the second die, the DTPS interconnect fields comprising a plurality of DTPS interconnects for connecting the first and second dies to the package support, and
wherein a die-to-die (DTD) interconnect field on a second face of the first die is substantially identical to a DTD interconnect field on a second face of the second die, the DTD interconnect fields comprising a plurality of DTD interconnects.

2. The microelectronic assembly of claim 1, further comprising an insulator material on the first face of the second die, wherein the DTPS interconnects of the second die extend through the insulator material.

3. The microelectronic assembly of claim 1, further comprising an insulator material on the second face of the second die, wherein the DTD interconnects of the second die extend through the insulator material.

4. The microelectronic assembly of claim 1, further comprising an insulator material on the first and second faces of the second die, wherein the DTPS interconnects and the DTD interconnects extend through the insulator material.

5. The microelectronic assembly of claim 1, further comprising a third die, wherein the interposer is between the third die and the package support.

6. The microelectronic assembly of claim 5, wherein an active face of the second die is connected to an active face of the third die with the DTD interconnects and an inactive face of the second die opposite the active face of the second die is connected to the package support with the DTPS interconnects.

7. The microelectronic assembly of claim 6, wherein the DTD interconnects include solder.

8. The microelectronic assembly of claim 6, wherein the DTPS interconnects include solder.

9. The microelectronic assembly of claim 5, wherein an inactive face of the second die is connected to an active face of the third die with the DTD interconnects, and an active face of the second die opposite the inactive face of the second die is connected to the package support with the DTPS interconnects.

10. The microelectronic assembly of claim 9, wherein the DTD interconnects include solder.

11. The microelectronic assembly of claim 9, wherein the DTPS interconnects include solder.

12. A device assembly, comprising:
a circuit board; and
a microelectronic assembly coupled with the circuit board, wherein the microelectronic assembly includes:
a package support,
an interposer above the package support,
a first die in the interposer, the first die including through-substrate vias (TSVs), and a second die in the interposer, the second die lacking TSVs, wherein a die-to-package support (DTPS) interconnect field on a first face of the first die is substantially identical to a DTPS interconnect field on a first face of the second die, the DTPS interconnect fields comprising a plurality of DTPS interconnects for connecting the first and second dies to the package support, and wherein a die-to-die (DTD) interconnect field on a second face of the first die is substantially identical to a DTD interconnect field on a second face of the second die, the DTD interconnect fields comprising a plurality of DTD interconnects.

13. The device assembly of claim 12, further comprising an insulator material on the first face of the second die, wherein the DTPS interconnects of the second die extend through the insulator material.

14. The device assembly of claim 12, further comprising an insulator material on the second face of the second die, wherein the DTD interconnects of the second die extend through the insulator material.

15. The device assembly of claim 12, further comprising an insulator material on the first and second faces of the second die, wherein the DTPS interconnects and the DTD interconnects extend through the insulator material.

16. The device assembly of claim 12, further comprising a third die, wherein the interposer is between the third die and the package support.

17. The device assembly of claim 16, wherein an active face of the second die is connected to an active face of the third die with the DTD interconnects and an inactive face of the second die opposite the active face of the second die is connected to the package support with the DTPS interconnects.

18. The device assembly of claim 17, wherein the DTD interconnects or the DTPS interconnects include solder.

19. A method of fabricating a microelectronic assembly, the method comprising:

providing a package support;

providing an interposer above the package support;

providing a first die in the interposer, the first die including through-substrate vias (TSVs); and providing a second die in the interposer, the second die lacking TSVs, wherein a die-to-package support (DTPS) interconnect field on a first face of the first die is substantially identical to a DTPS interconnect field on a first face of the second die, the DTPS interconnect fields comprising a plurality of DTPS interconnects for connecting the first and second dies to the package support, and wherein a die-to-die (DTD) interconnect field on a second face of the first die is substantially identical to a DTD interconnect field on a second face of the second die, the DTD interconnect fields comprising a plurality of DTD interconnects.

20. The method of claim 19, further comprising:

providing an insulator material on the first face of the second die, wherein the DTPS interconnects of the second die extend through the insulator material.

\* \* \* \* \*